(12) United States Patent
Kang

(10) Patent No.: US 7,283,383 B2
(45) Date of Patent: *Oct. 16, 2007

(54) PHASE CHANGE RESISTOR CELL, NONVOLATILE MEMORY DEVICE AND CONTROL METHOD USING THE SAME

(75) Inventor: Hee Bok Kang, Daejeon (KR)

(73) Assignee: Hynix Semiconductor Inc., Icheon-si (KR)

( * ) Notice: Subject to any disclaimer, the term of this patent is extended or adjusted under 35 U.S.C. 154(b) by 68 days.

This patent is subject to a terminal disclaimer.

(21) Appl. No.: 10/876,464

(22) Filed: Jun. 28, 2004

(65) Prior Publication Data

US 2005/0128785 A1 Jun. 16, 2005

(30) Foreign Application Priority Data

Dec. 13, 2003 (KR) .................. 10-2003-0090962

(51) Int. Cl.
*G11C 11/00* (2006.01)
(52) U.S. Cl. .................. 365/148; 365/175; 365/113
(58) Field of Classification Search ............... 365/148
See application file for complete search history.

(56) References Cited

U.S. PATENT DOCUMENTS

| 4,731,610 | A | * | 3/1988 | Baron et al. ......... 257/E27.133 |
| 4,782,340 | A | * | 11/1988 | Czubatyj et al. ....... 257/E27.07 |
| 6,579,760 | B1 | | 6/2003 | Lung |
| 6,750,101 | B2 | * | 6/2004 | Lung ......................... 365/103 |
| 6,781,858 | B2 | * | 8/2004 | Fricke et al. ................ 365/51 |
| 6,813,177 | B2 | * | 11/2004 | Lowrey et al. ............. 365/148 |
| 6,831,856 | B2 | * | 12/2004 | Pashmakov .................. 365/163 |
| 6,839,263 | B2 | * | 1/2005 | Fricke et al. ................ 365/63 |
| 2004/0188668 | A1 | * | 9/2004 | Hamann et al. ............... 257/2 |

FOREIGN PATENT DOCUMENTS

KR 1020030081900 A 10/2003

* cited by examiner

*Primary Examiner*—Huan Hoang
(74) *Attorney, Agent, or Firm*—Townsend and Townsend and Crew LLP

(57) ABSTRACT

A nonvolatile memory device features a phase change resistor cell as a cross-point cell using a phase change resistor and a serial diode switch. The phase change resistor has logic data corresponding to a crystallization state changed by the amount of current supplied from a word line. The serial diode switch, connected between the phase change resistor and a bit line, comprises at least two or more diode switches serially connected, wherein each end portion of the diode switch is connected in common to the phase change resistor and the bit line and selectively switched depending on voltages applied to the word line and the bit line. The nonvolatile memory device is configured with the phase change resistor cell, and voltages applied to a word line and a bit line are controlled to read and write data. As a result, the whole size of the memory device is reduced.

20 Claims, 14 Drawing Sheets

PHASE CHANGE RESISTOR CELL, NONVOLATILE MEMORY DEVICE AND CONTROL METHOD USING THE SAME

BACKGROUND OF THE INVENTION

1. Field of the Invention

The present invention generally relates to a memory device, and more specifically, to a phase change resistor cell comprising a cross-point cell using a phase change resistor and a serial diode switch, a nonvolatile memory device using the phase change resistor cell to improve the whole size, and a control method using the same.

2. Description of the Prior Art

In general, nonvolatile memories such as a magnetic memory and a phase change memory (hereinafter, referred to as "PCM") has a data processing speed as fast as a volatile Random Access Memory (hereinafter, referred to as "RAM") and conserves data even after the power is turned off.

FIGS. 1a to 1d are diagrams illustrating a conventional phase change resistor 4 (hereinafter, referred to as "PCR").

The PCR 4 comprises a top electrode 1, a bottom electrode 3 and a PCM 2 inserted therebetween. If a voltage or current is applied to the PCR 4, the PCM 2 reaches a high temperature state. As a result, resistance is changed, and then an electric conduction state is also changed. Here, AgInSbTe has been widely used as the PCM 2.

As shown in FIG. 1c, if low current having less than a threshold value flows in the PCR 4, the PCM 2 is heated to a proper temperature for crystallization. As a result, the PCM 2 is changed into a crystalline phase, and the PCR 4 reaches a low resistance state.

On the other hand, as shown in FIG. 1d, if high current having more than the threshold value flows in the PCR 4, the PCM 2 is heated at a temperature of over a melting point. AS a result, the PCM 2 is changed into an amorphous phase, and reaches a high resistance state.

As described above, the PCR 4 can store data corresponding to the states of two resistances as nonvolatile sates. In other words, if the low resistance state of the PCR 4 refers to data "1" and the high resistance state of the PCR 4 refers to data "0", the PCR 4 can store logic values of the two data.

Meanwhile, the conventional memory device comprises a switch device and a memory device for storing data. Here, the switching device of the conventional memory device is a NMOS transistor whose switching operation is controlled by a gate control signal.

However, the above-described NMOS transistor requires an additional area for gate control when a cell array is embodied with a switching device, which results in increase of the whole chip size.

SUMMARY OF THE INVENTION

Accordingly, it is a first object of the present invention to embody a phase change resistor cell comprising a serial diode switch using a Silicon On Insulator (hereinafter, referred to as "SOI") wafer.

It is a second object of the present invention to reduce the whole size of a nonvolatile memory device by embodying a cross-point cell using a PCR and a serial diode switch.

It is a third object of the present invention to improve operation characteristics of a memory cell by effectively driving read/write operations in a cell array using the PCR and the serial diode switch.

In an embodiment, a phase change resistor cell comprises a phase change resistor formed where a word line and a bit line are crossed, and a serial diode switch. The phase change resistor has logic data corresponding to a crystallization state changed by the amount of current supplied from a word line. The serial diode switch, connected between the phase change resistor and a bit line, comprises at least two or more diode switches serially connected. Here, each end portion of the diode switch is connected in common to the phase change resistor and the bit line and selectively switched depending on voltages applied to the word line and the bit line.

Preferably, the serial diode switch comprises a plurality of PN diode chains in a silicon layer formed horizontally on an insulating layer formed on a silicon substrate, a first upper portion of the silicon layer is contacted with the phase change resistor at a predetermined location, and second upper portions of the silicon layer are contacted with the bit line at both ends, and a node for contacting the silicon layer with the phase change resistor is shared in a P-type region adjacent to a N-type region at the corresponding location.

In an embodiment, a nonvolatile memory device using a phase change resistor cell comprises a plurality of phase change resistor cell arrays, a plurality of word line driving units and a plurality of sense amplifiers. Each of the plurality of phase change resistor cell arrays includes a plurality of phase change resistor cells. The plurality of word line driving units selectively drive word lines of the plurality of phase change resistor cell arrays. The plurality of sense amplifiers sense and amplify data applied through bit lines from the plurality of phase change resistor cell arrays. Here, the phase resistor cell has the above-described structure.

In an embodiment, a method for controlling a nonvolatile memory device using a phase change resistor cell for sensing a crystallization state changed by the amount of current applied to a phase change resistor and storing data corresponding to change of a resistance comprises the steps of: performing a low temperature heating operation for a predetermined time by dropping a voltage level step by step applied to both terminals of the phase change resistor when data to be written in the phase change resistor cell is a first logic data; and performing a high temperature heating operation for a predetermined time by maintaining a constant voltage application state to both terminals of the phase change resistor when data to be written in the phase change resistor cell is a second logic data.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1A:
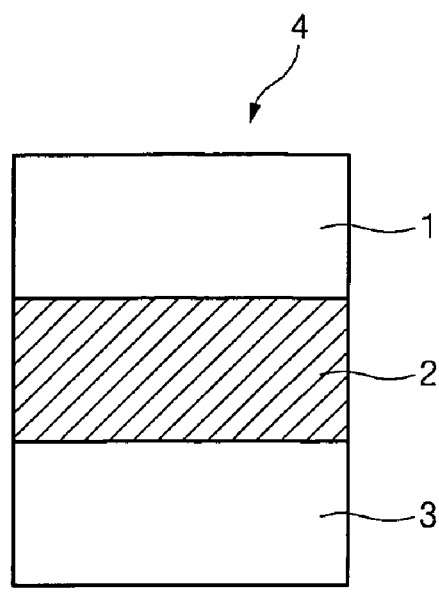
FIGS. 1a to 1d are diagrams illustrating a conventional phase change resistor.
Figure 1B:
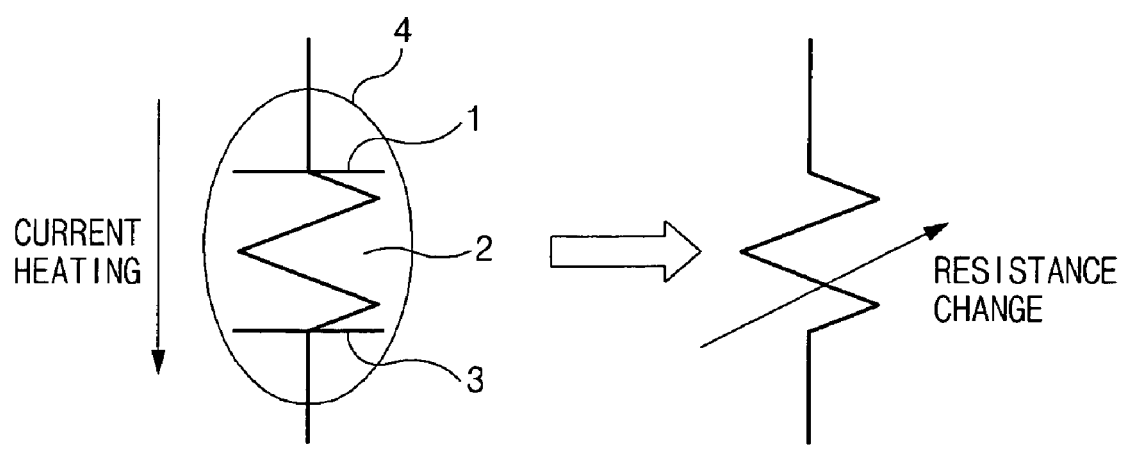
Figure 1C:
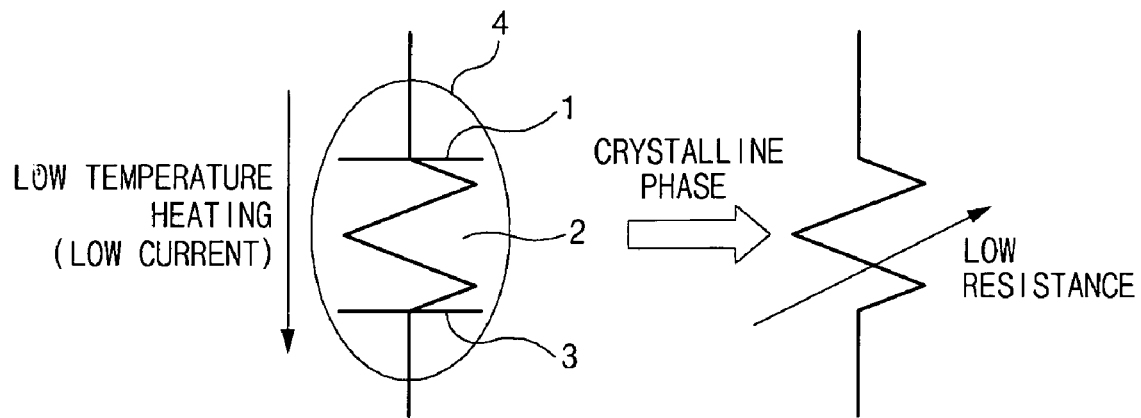
Figure 1D:
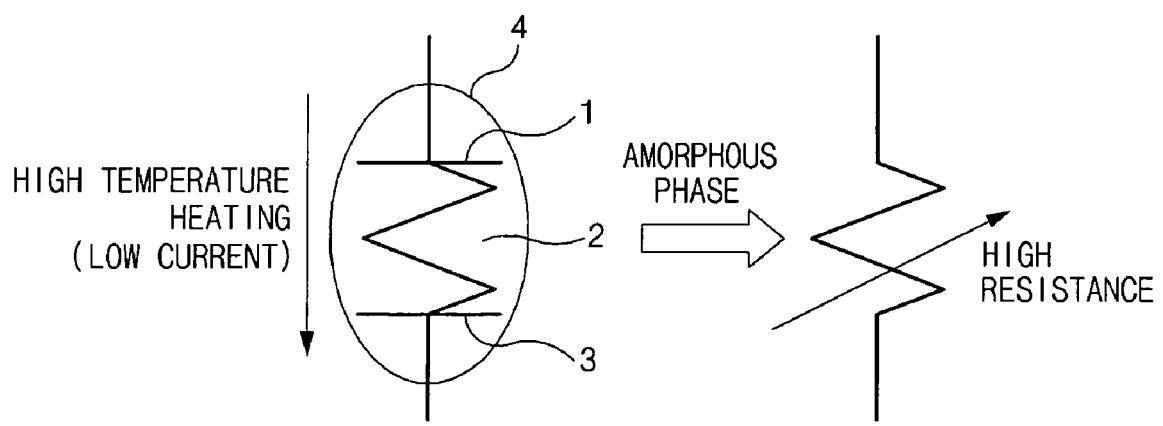
Figure 2:
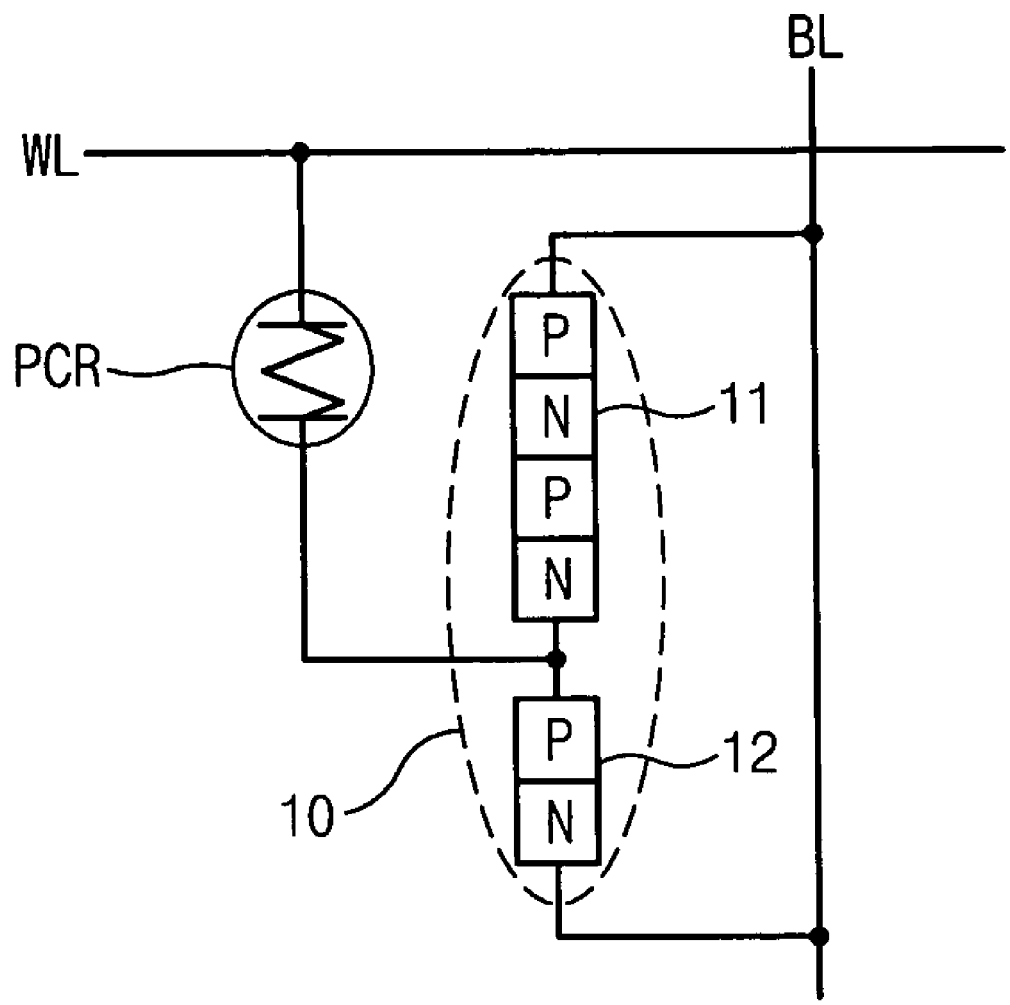
FIG. 2 is a circuit diagram of a phase change resistor cell according to an embodiment of the present invention.

FIG. 2 is a circuit diagram of a phase change resistor cell according to an embodiment of the present invention.

A PCR cell comprises a PCR and a serial diode switch 10. Here, the serial diode switch 10 is connected in parallel to a bit line BL, and the PCR is contacted with a word line WL. Also, the serial diode switch 10 comprises a PNPN diode switch 11 and a PN diode switch 12 which are connected in parallel.

The PNPN diode switch 11 is connected in a reverse direction between the PCR and the bit line BL, and the PN diode switch 12 is connected in a forward direction between the PCR and the bit line BL. The reverse and forward directions are defined on a basis of the PCR which is formed between the serial diode switch 10 and the word line WL.

Figure 3:
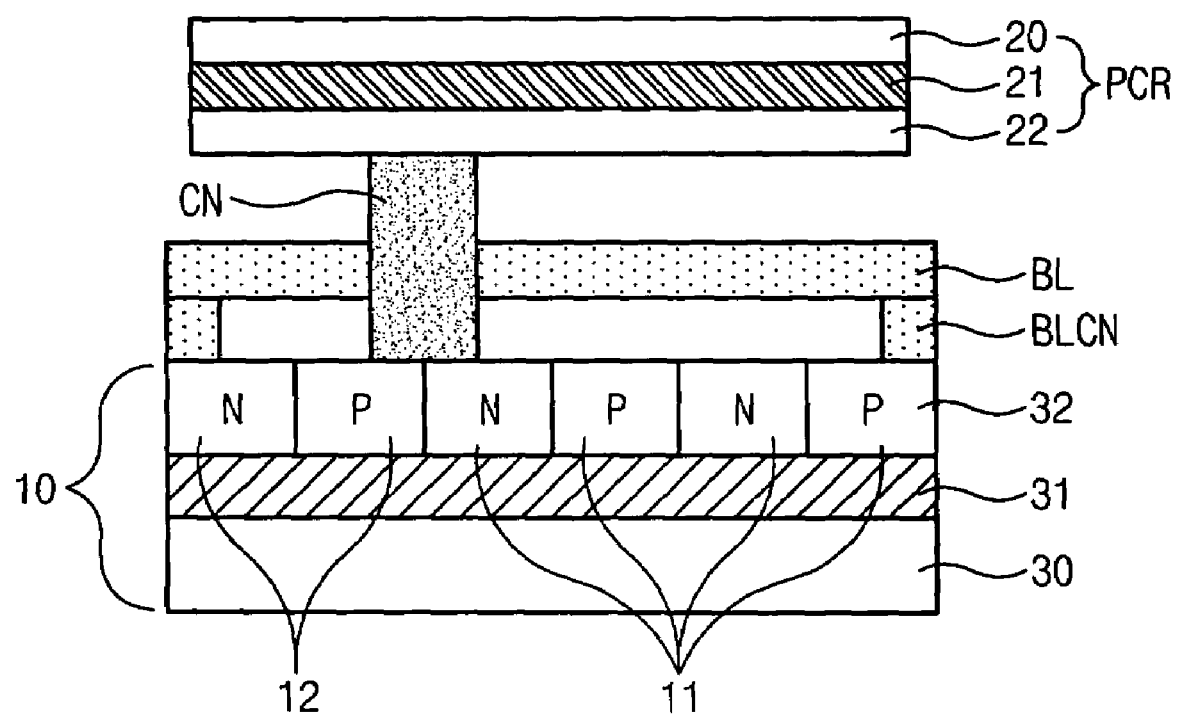
FIG. 3 is a cross-sectional diagram illustrating a cross-section corresponding to a portion III-III of FIG. 5 of the phase change resistor cell of FIG. 2.
Figure 4:
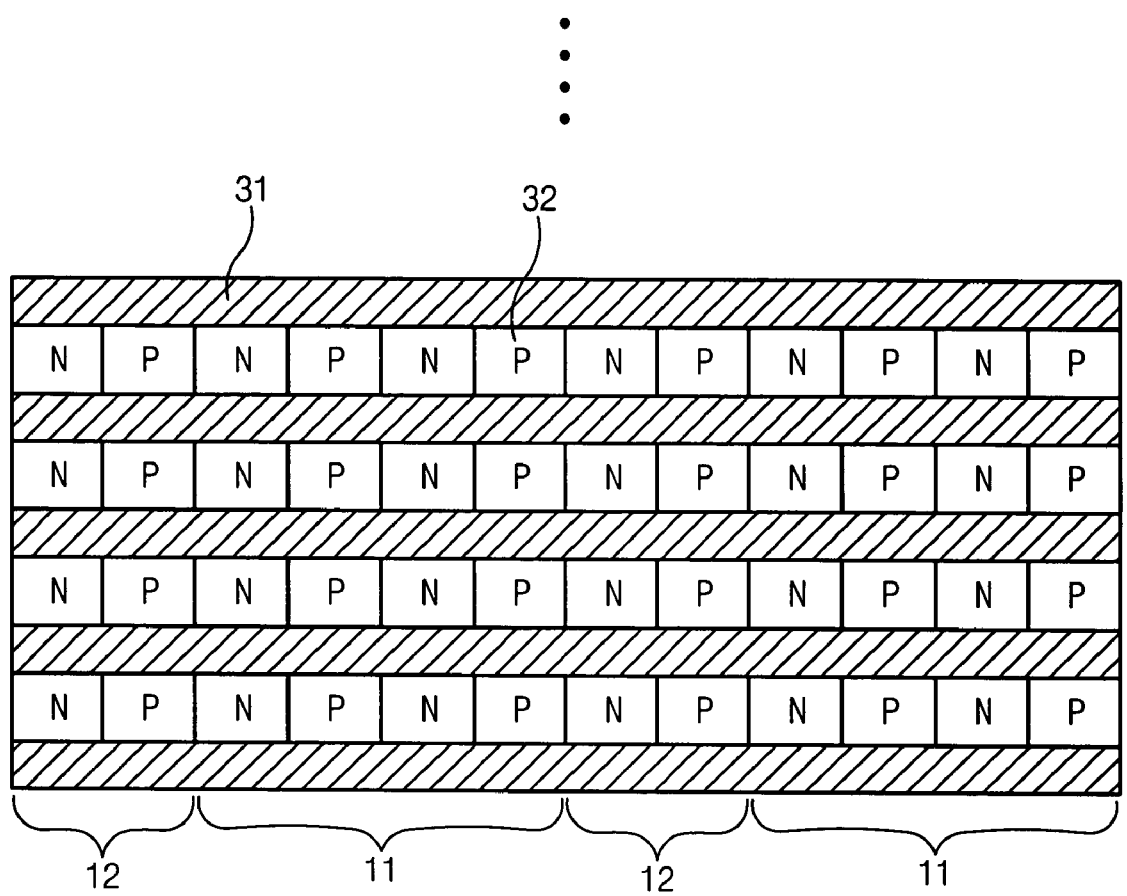
FIG. 4 is a diagram of a serial diode switch of FIG. 3.

FIG. 3 is a cross-sectional diagram of the PCR cell of FIG. 2, and FIG. 4 is a diagram of the serial diode switch 10.

An insulating layer 31 is formed on a silicon substrate 30, and a silicon layer 32 is formed on the insulating layer 31. A region doped with P-type impurities and a region doped with N-type impurities are alternately formed in the silicon layer 32 which is the serial diode switch 10.

The insulating layer 31 is formed of $SiO_2$, and the silicon layer 32 is formed of epitaxial silicon or deposition polysilicon.

The silicon layer 32 comprises a plurality of rows, and a single row separated by the insulating layer 31 comprises a diode chain comprising a PNPN diode switch 11 and a PN diode switch 12 which are connected serially.

In the PNPN diode switch 11, the P-type region and the N-type region are alternately arranged, and the pair of the P-type region and the N-type region is connected serially. The PN diode switch 12 adjacent to the PNPN diode switch 11 comprises a plurality of the P-type region and the N-type region which are connected serially.

A bit line contact node BLCN is formed on the top portion of the N-type region and the P-type region located at both end portions of the diode chain which comprises the PNPN diode switch 11 and the PN diode switch 12. The upper portion of the node BLCN is connected to the bit line BL.

A common contact node CN is formed on the top portion of the P-type region and the N-type region where the PN diode switch 12 and the PNPN diode switch 11 are contacted, and a bottom electrode 22 of the PCR is connected through the common contact node CN to the top portion of the P-type region and the N-type region.

Here, the PCR comprises a top electrode 20 connected to the word line WL, a PCM 21 and a bottom electrode 22.

Figure 5:
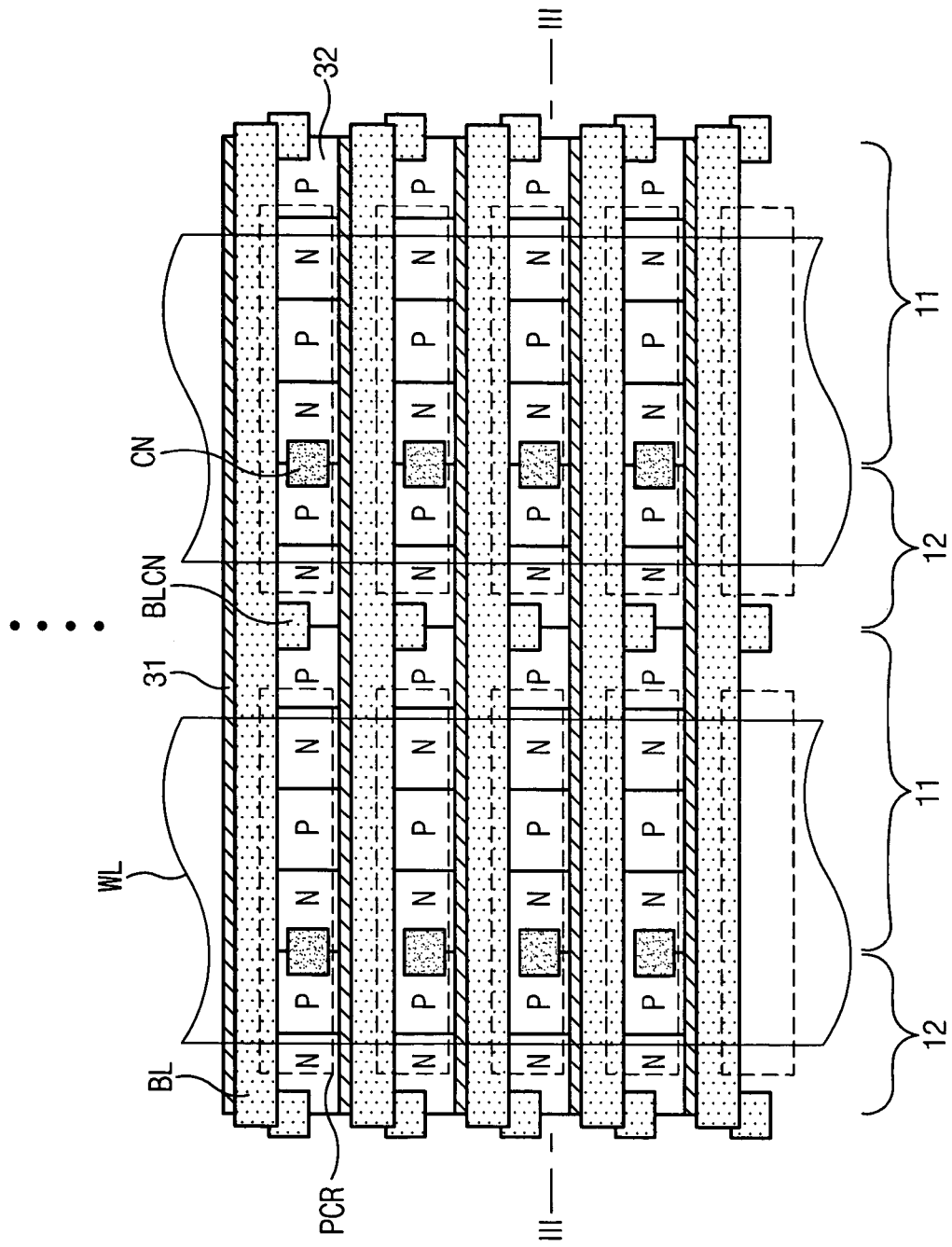
FIG. 5 is a layout diagram of the phase change resistor cell of FIG. 2.

FIG. 3 is a cross-sectional diagram illustrating a cross-section corresponding to a portion III-III of FIG. 5. Here, the bit line BL is illustrated for convenience of explanation although the bit line BL is not shown in the actual cross section.

The serial diode switch 10 comprises a plurality of serial chains of the PNPN diode switch 11 and the PN diode switch 12 included in the silicon layer 32 as shown in FIG. 4. A plurality of the serial diode switches 10 are formed on the insulating layer 31 in parallel. The serial diode switch 10 is formed to have the SOI structure, and each serial diode switch 10 is separated by the insulating layer 31.

FIG. 5 is a layout diagram of the phase change resistor cell 10 of FIG. 2.

The PNPN diode switch 11 and the PN diode switch 12 which are connected serially are formed in the silicon layer 32 consisting of epitaxial silicon or polysilicon, and each serial diode switch 10 is insulated by the insulating layer 31. The contact node CN is formed between the PN region and the PNPN region of the serial diode switch 10. The contact node CN is contacted in common with the P-type region adjacent to the N-type region.

The N-type region and the P-type region of both end portions of the serial diode switch 10 is connected through the bit line contact node BLCN to the bit line BL. The bit line contact node BLCN is connected in common to the bit line contact node BLCN of the adjacent phase change resistor cell. The contact node BLCN connected to the same bit line may be shared with the serial diode switch 10 of the adjacent PCR cell.

The word line WL is formed on the phase change resistor PCR.

Figure 6:
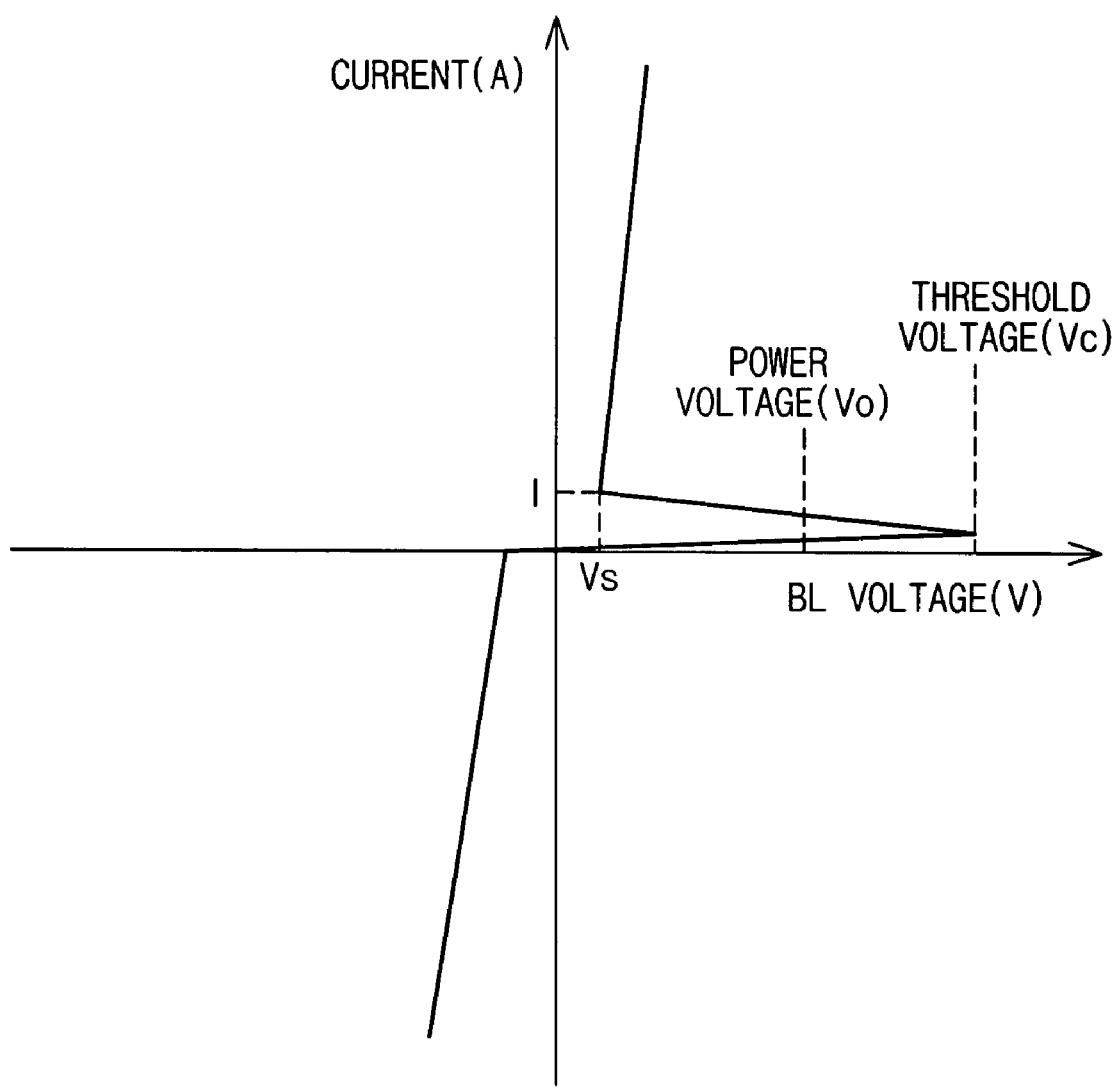
FIG. 6 is a graph illustrating the operation of the serial diode switch of FIG. 2.

FIG. 6 is a graph illustrating the operation of the serial diode switch 10 of FIG. 2.

Although a voltage applied to the PCR increases in a positive direction on a basis of the bit line BL and reaches a voltage Vo, the serial diode switch 10 is kept off by operation characteristics of the PNPN diode switch 11. As a result, current does not flow in the PCR.

Thereafter, if a voltage applied to the bit line BL more increases and reaches a threshold voltage Vc, the PNPN diode switch 11 is turned on by the forward operation characteristic of the diode. As a result, the serial diode switch 10 is turned on, and the amount of current dramatically increases. Here, when the voltage applied to the bit line BL is over the threshold voltage Vc, a value of current I connected to the bit line BL is affected by resistance (not shown) connected to the PCR to serve as load.

After the PNPN diode switch 11 is turned on, the large amount of current can flow although a small voltage Vs is applied to the PCR. Here, the PN diode switch 10 is kept off by the reverse operation characteristic.

On the other hand, if a predetermined voltage is applied to the word line WL and the voltage applied to the PCR increases toward a negative direction on the basis of the bit line BL, the serial diode switch 10 is turned on by the forward operation characteristic of the PN diode switch 10. Then, current flows at a random operation voltage state. Here, the PNPN diode switch 11 is kept by the reverse operation characteristic.

Figure 7:
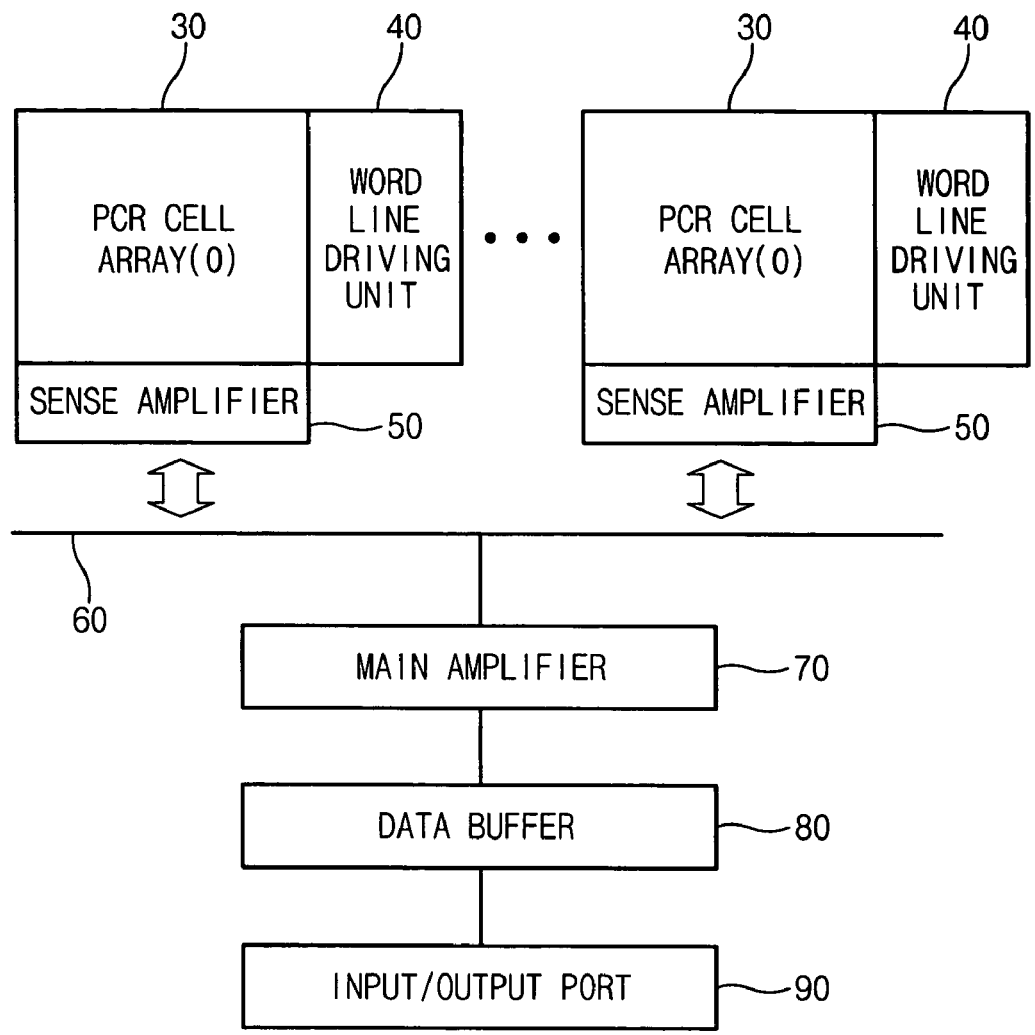
FIG. 7 is a block diagram of a nonvolatile memory device using a phase change resistor cell according to an embodiment of the present invention.

FIG. 7 is a diagram of a nonvolatile memory device suing a phase change resistor cell according to an embodiment of the present invention.

In an embodiment, the nonvolatile memory device comprises a plurality of PCR cell arrays 40, a plurality of word line driving units 50, a plurality of sense amplifiers 60, a data bus 70, a main amplifier 80, a data buffer 90 and an input/output port 100.

Each PCR cell array 40 comprises a plurality of PCR cells arranged in row and column directions as described in FIG. 2. A plurality of word lines WL arranged in the row direction are connected to the word line driving unit 50. A plurality of bit lines BL arranged in the column direction are connected to the sense amplifier 60.

Here, one PCR cell array 40 is correspondingly connected to one word line driving unit 50 and one sense amplifier 60.

The plurality of sense amplifiers 60 share one data bus 70. The data bus 70 is connected to the main amplifier 80 which amplifies data applied from each sense amplifier 60 through the data bus 70.

The data buffer 90 buffers the amplified data applied from the main amplifier 80. The input/output port 100 outputs output data applied from the data buffer 90 to the outside or applies input data applied from the outside to the data buffer 90.

Figure 8:
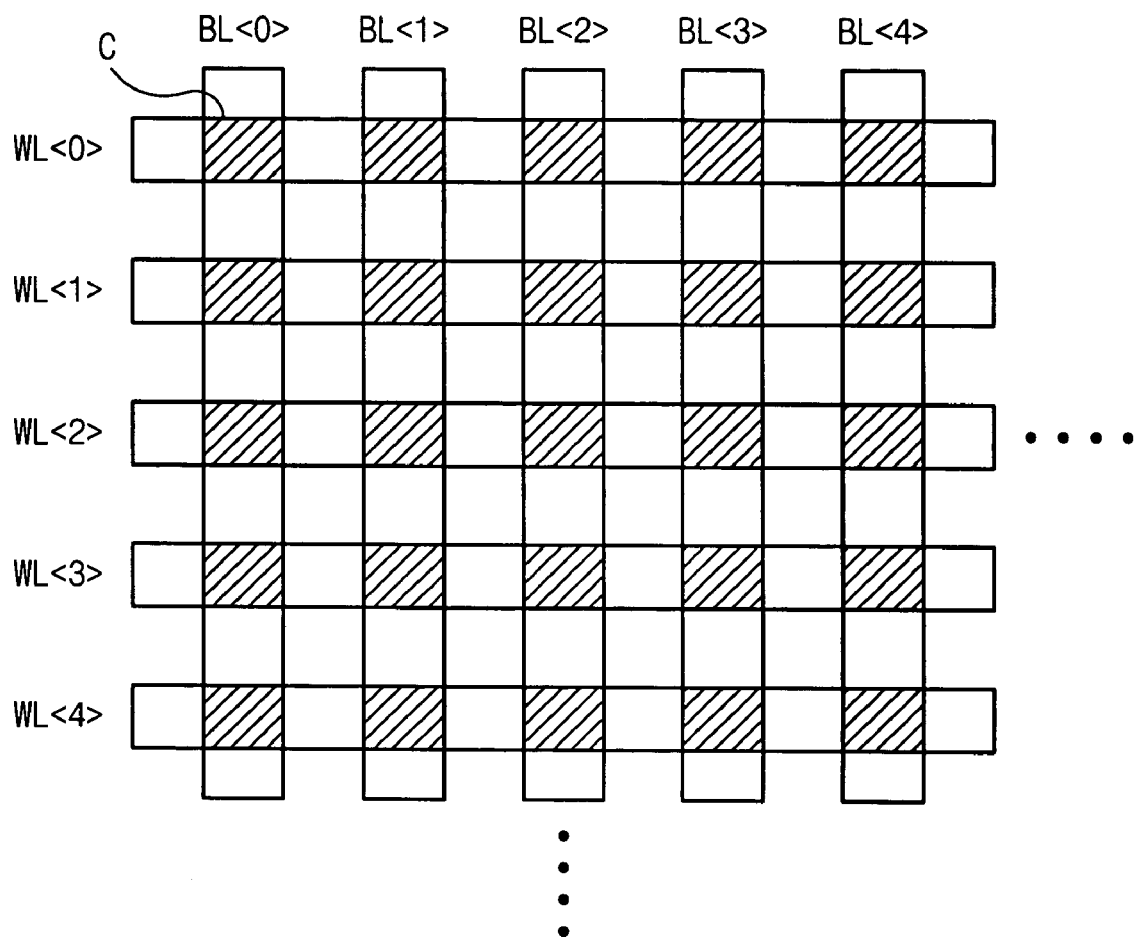
FIG. 8 is a layout diagram of a phase change resistor cell array of FIG. 7.

FIG. 8 is a layout diagram of the phase change resistor cell array 40 of FIG. 7.

The PCR cell array 40 comprises a plurality of word lines WL arranged in the row direction and a plurality of bit lines BL arranged in the column directions. A unit cell C is located only where the word line WL and the bit line BL are crossed. That is, a cross-point cell is embodied. Since it is unnecessary to form devices in other regions, a cell can be formed in a space necessary to form the word line WL and the bit line BL without requiring an additional area.

Here, the cross-point cell refers to a PCR cell using a hybrid switch HSW located where a bit line BL and a word line WL are crossed.

Figure 9:
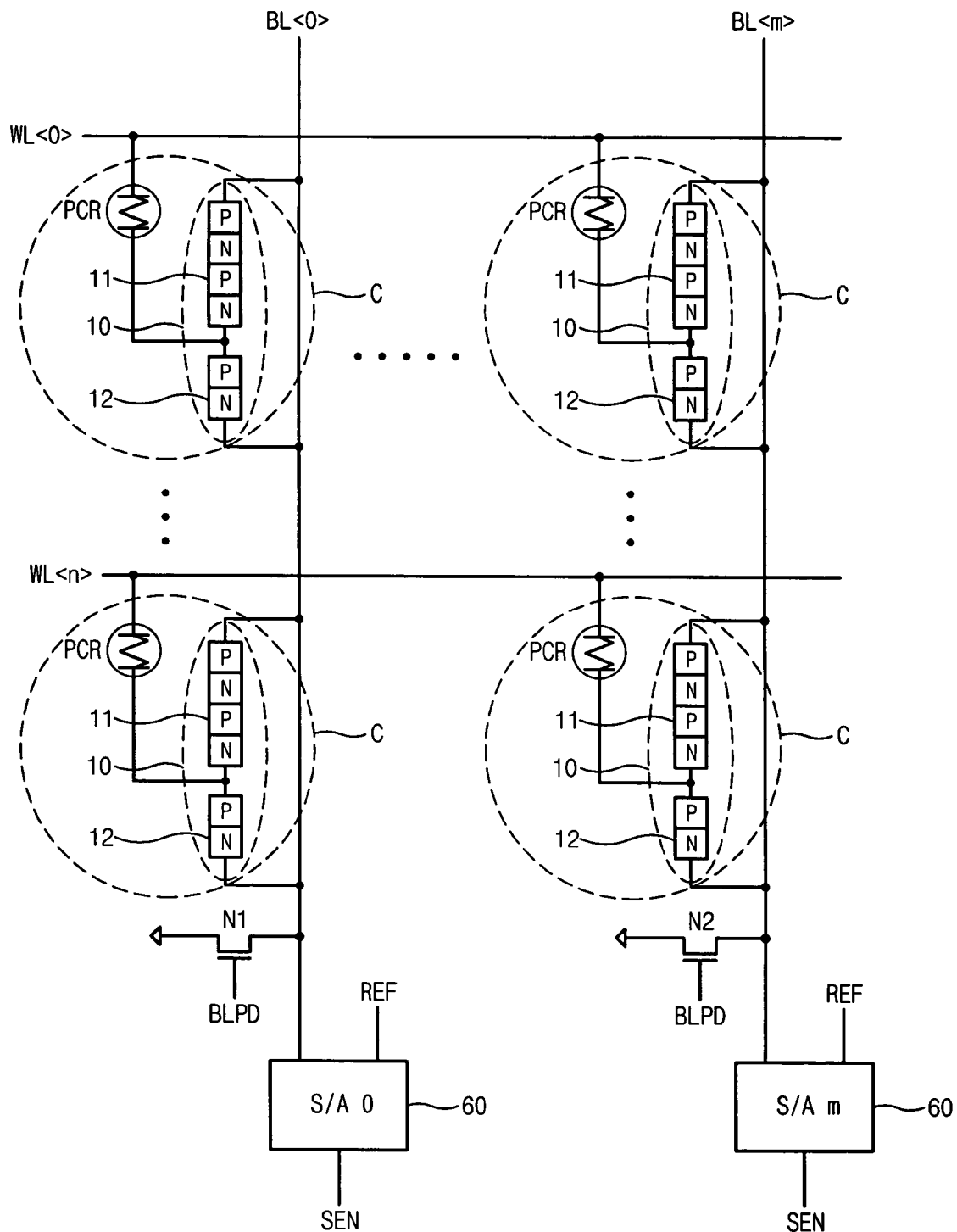
FIGS. 9 and 10 are diagrams illustrating examples of the phase change resistor cell array of FIG. 7.

FIG. 9 is a circuit diagram of the PCR cell array 40 of FIG. 7.

The PCR cell array 40 comprises a plurality of word lines WL<0>~WL<n> arranged in the row direction and a plurality of bit lines BL<0>~BL<m> arranged in the column direction. A unit cell C is located only where the word line WL and the bit line BL are crossed. Here, the unit cell C comprises one PCR and one serial diode switch 10.

The plurality of sense amplifiers 60 are connected one by one to the bit lines BL. Each sense amplifier 60 compares a voltage applied from the bit line BL with a reference voltage REF previously set when a sense amplifier enable signal SEN is activated, and amplifies the comparison result.

A bit line pull-down device N1 is connected to the bit line BL<0>, and a bit line pull-down device N2 is connected to the bit line BL<m>. When a bit line pull-down signal BLPD is activated, the bit line pull-down devices N1 and N2 apply a ground voltage to the bit line BL and pull down the bit line BL to a ground level.

The above-described PCR cell array 40 is operated so that each PCR may store one data.

Figure 10:
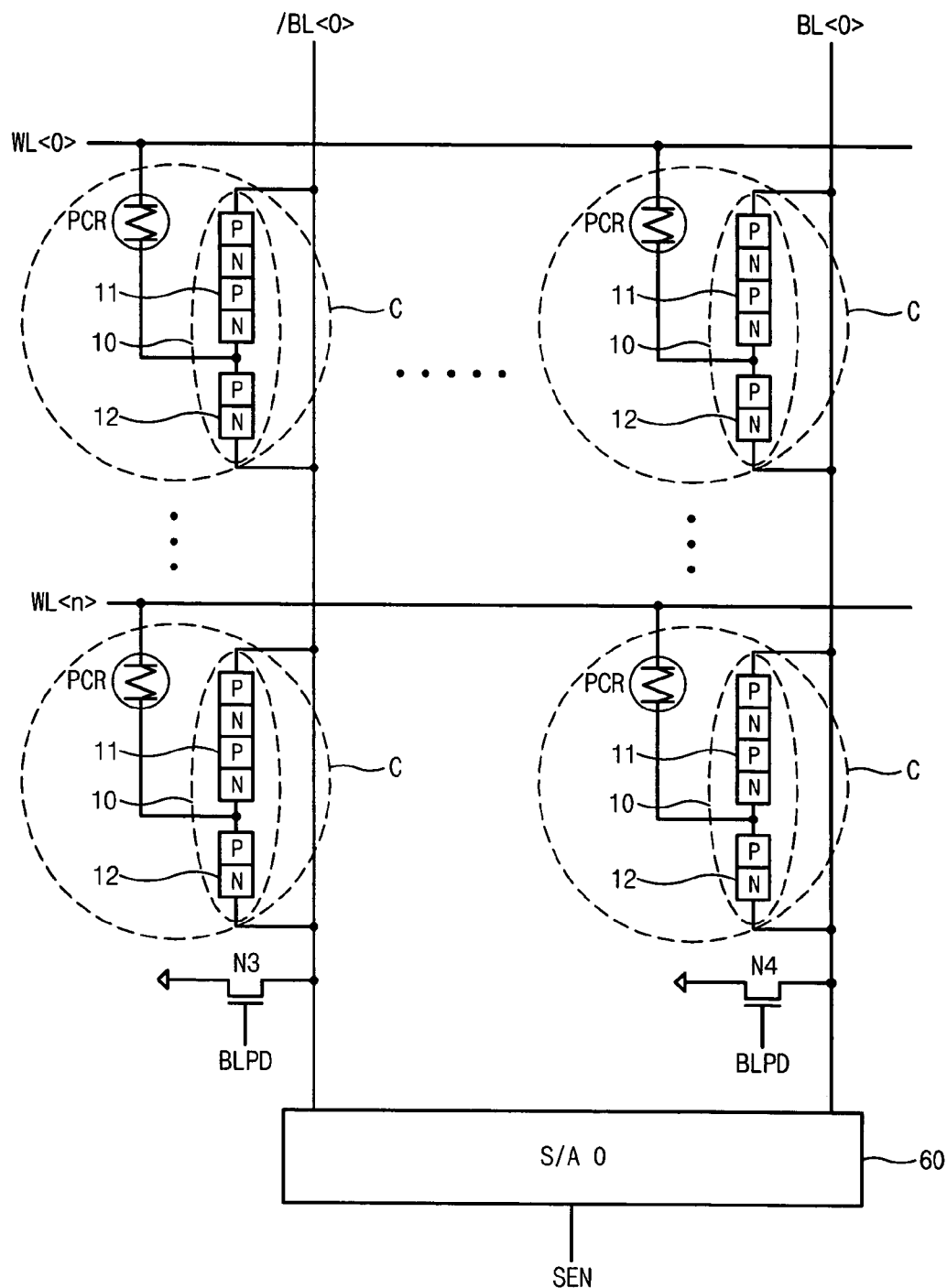

FIG. 10 shows another example of the PCR cell array 40 of FIG. 7.

The PCR cell array 40 comprises a plurality of word lines WL<0>~WL<n> arranged in the row direction and a plurality of paired bit lines BL and /BL arranged in the column direction. A unit cell C is located only where the paired bit lines BL and /BL are crossed. The unit cell C comprises one PCR and one serial diode switch 10.

One sense amplifier 60 is connected one by one to the paired bit lines BL and /BL. When a sense amplifier enable signal SEN is activated, each sense amplifier 60 is simultaneously operated to amplify data applied from the paired bit lines BL and /BL.

A bit line pull-down device N3 is connected to the bit line /BL<0>, and a bit line pull-down device N4 is connected to the bit line BL<0>. As a result, when a bit line pull-down signal BLPD is activated, the bit line pull-down devices N3 and N4 apply a ground voltage to the paired bit lines BL and /BL, and pull down the paired bit lines BL and /BL to a ground voltage level.

The above-described PCR cell array 40 is operated so that two PCRs may store one data.

Figure 11:
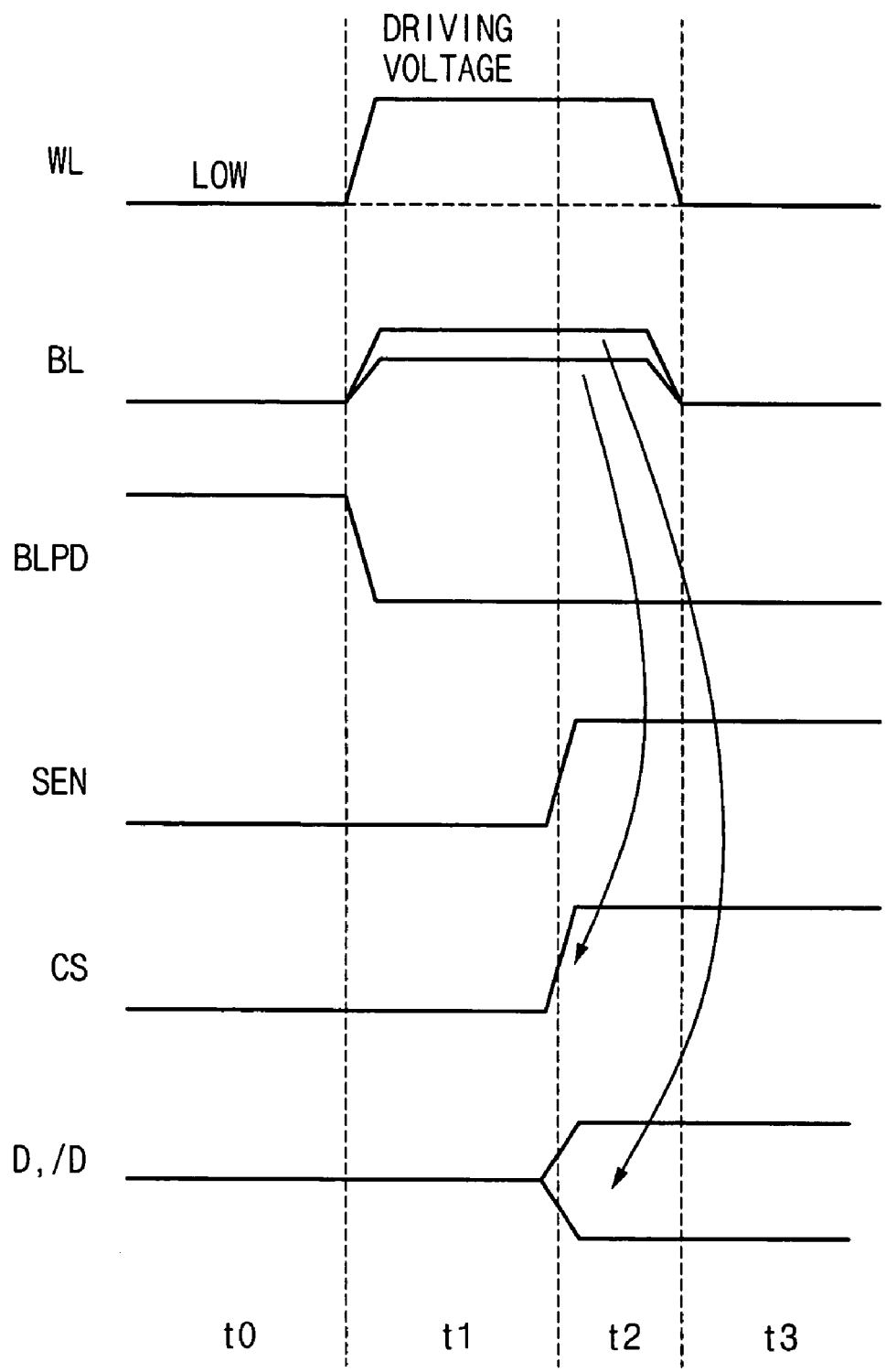
FIG. 11 is a timing diagram illustrating the read mode of the nonvolatile memory device using a phase change resistor cell according to an embodiment of the present invention.

FIG. 11 is a timing diagram illustrating the read mode of the nonvolatile memory device using a phase change resistor cell according to an embodiment of the present invention.

In an interval t0, the bit line pull-down signal BLPD is activated to turn on the NMOS transistors N1 and N2. As a result, the bit line BL is pulled down to the ground level.

When an interval t1 starts, if the word line WL transits to 'high' and a predetermined voltage is applied to the word line WL, the PN diode 12 of the serial diode switch 10 is turned on. As a result, data of the PCR cell are transmitted to the bit line BL. Here, the bit line pull-down signal BLPD transits to 'low'.

Next, in an interval t2, if the sense amplifier enable signal transits to 'high', the sense amplifier 60 is operated to amplify data applied from the bit line BL. If a column selecting signal CS transits to 'high', a column selecting switching unit (not shown) is turned on. As a result, data D and /D in the bit line BL are outputted to the data bus 70 to read data stored in the PCR cell C.

Thereafter, when an interval t3 starts, if the word line transits to 'low', the PCR cell is disconnected from the bit line BL. As a result, the read operation is completed. Here, the PN diode switch 12 and the PNPN diode switch 11 of the serial diode switch 10 are kept off.

Figure 12:
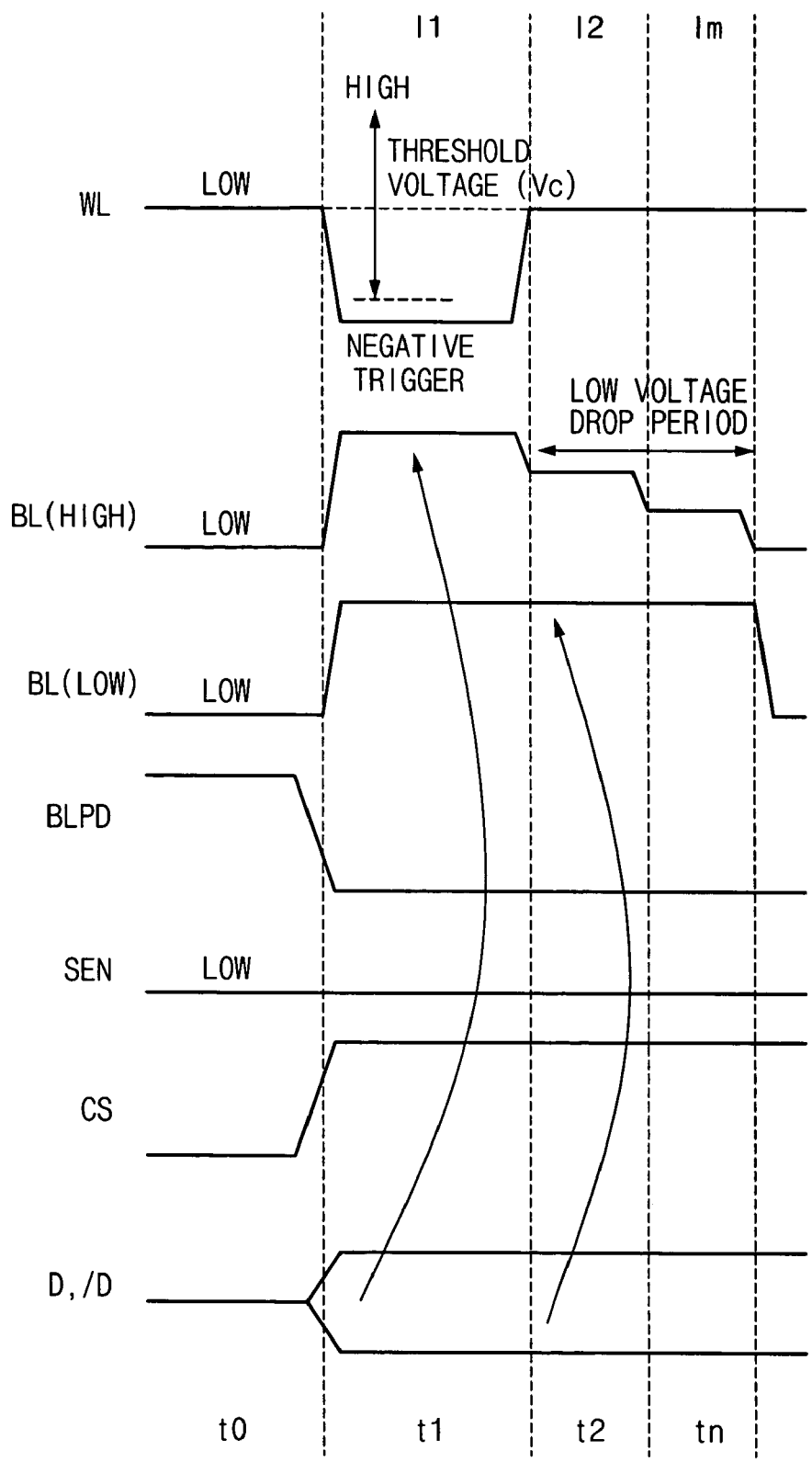
FIG. 12 is a timing diagram illustrating the write mode of the nonvolatile memory device using a phase change resistor cell according to an embodiment of the present invention.

FIG. 12 is a timing diagram illustrating the write mode of the nonvolatile memory device using a phase change resistor cell according to an embodiment of the present invention.

In the write mode, the sense amplifier enable signal SEN is maintained at the low level.

In an interval t0, the bit line pull-down signal BLPD is activated to turn on the NMOS transistors N1 and N2. As a result, the bit line BL is pulled down to the ground level.

Thereafter, when an interval t1, the bit line pull-down signal BLPD transits to 'low'. If the column selecting signal CS transits to 'high', the column selecting switching unit (not shown) is turned on, and new data D and /D to be written through the data bus 70 are inputted to the bit line BL. Here, suppose that the data applied to the bit line BL in the write mode are 'high' or 'low'.

At this sate, a voltage of the word line WL transits to a negative voltage which corresponds to a value of less than the threshold voltage Vc. That is, a difference between a low voltage level of the bit line BL and a negative voltage level of the word line WL does not reach to the level of the threshold voltage Vc to turn on the PNPN diode switch 11 of the serial diode switch 10.

However, a voltage of over the threshold voltage Vc to turn on the PNPN diode switch 11 is applied to the hybrid switch HSW by a difference between a high amplifying voltage of the bit line BL and a negative voltage of the word line WL. As a result, the PNPN diode switch 11 is turned on to write data in the PCR.

After PNPN diode switch 11 is turned on, a large amount of current I1 can flow although a small voltage Vs is applied to the PCR as shown in the operation characteristics of FIG. 6. As a result, the sufficient amount of current flows to write data in the PCR even when the voltage of the word line WL rises from the negative voltage level to the low level after the interval t1.

Thereafter, during intervals t2~tn, the voltage level is controlled to drop differently depending on patterns of data applied to the bit line BL.

In other words, when a voltage level having a high data value is applied to the bit line BL, the voltage level of the bit line BL is controlled to drop step by step during the intervals t2~tn. On the other hand, when a voltage level having a data low value is applied to the bit line BL, the voltage level of the bit line BL is continuously controlled to the high state during the intervals t2~tn.

Figure 13:
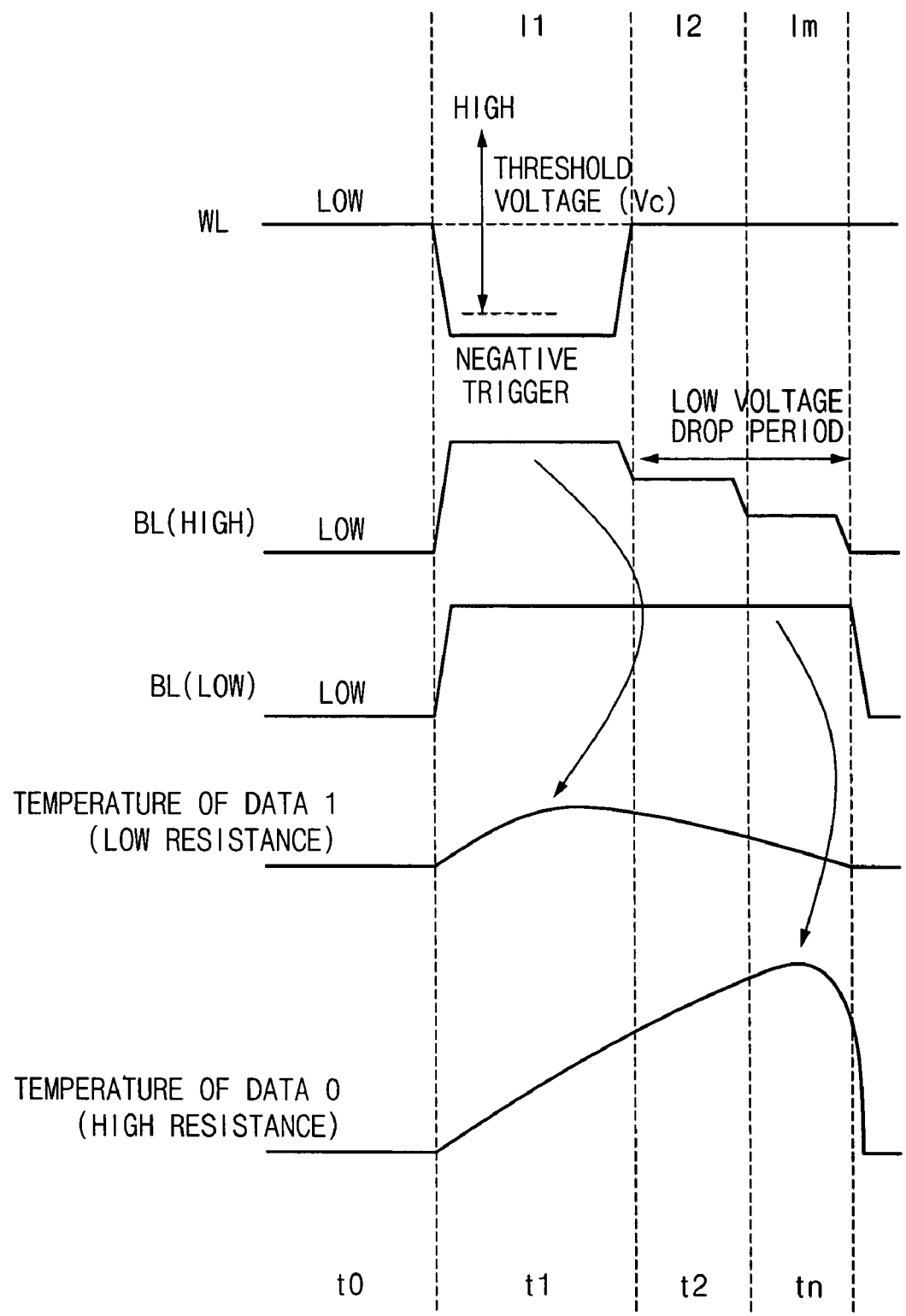
FIG. 13 is a diagram illustrating temperature characteristics of the phase change resistor cell in the write mode of the nonvolatile memory device suing a phase change resistor cell according to an embodiment of the present invention.

As shown in FIG. 13, when data in the bit line BL is 'high', the level of the voltage applied to the bit line BL drops step by step to maintain the crystalline sate. As a result, in the interval t1, a temperature characteristic of data 'high' reaches the peak and then gradually decreases, and the PCR represent a low resistance characteristic.

On the other hand, when data in the bit line BL is 'low', the temperature of the PCR is required to rise to maintain the amorphous state of the PCR. That is, as temperature becomes higher, the PCR has an improved high resistance characteristic at the amorphous state.

Here, a restoration operation is not required because data are stored in the PCR having a nonvolatile characteristic.

As discussed earlier, a nonvolatile memory device using a phase change resistor cell according to an embodiment of the present invention provides the following effects: to embody a phase change resistor cell comprising a serial diode switch using a SOI wafer; to reduce the whole size of a nonvolatile memory device by embodying a cross-point cell using a PCR and a serial diode switch; and to improve operation characteristics of a memory cell by effectively driving read/write operations in a cell array using the PCR and the serial diode switch. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A phase change resistor cell comprising:
a phase change resistor for sensing a crystallization state changed by the amount of current supplied from a word line and storing data corresponding to change of a resistance; and
a serial diode switch including:
a first diode switch connected in a forward direction between the phase change resistor and a bit line; and
a second diode switch connected in a reverse direction between the phase change resistor and the bit line,
wherein the first diode switch and the second diode switch are serially connected.

2. The phase change resistor cell according to claim 1, wherein the serial diode switch comprises a plurality of PN diode chains in a silicon layer formed horizontally on an insulating layer formed on a silicon substrate,
a first upper portion of the silicon layer is contacted with the phase change resistor at a predetermined location, and second upper portions of the silicon layer are contacted with the bit line at both ends, and
a node for contacting the silicon layer with the phase change resistor is shared in a P-type region adjacent to a N-type region at the corresponding location.

3. The phase change resistor cell according to claim 2, wherein the phase change resistor and the serial diode switch are located where the bit line and the word line are crossed, thereby forming a cross-point cell.

4. The phase change resistor cell according to claim 2, wherein the silicon layer is formed by an epitaxial or deposition process.

5. The phase change resistor cell according to claim 2,
wherein the first diode switch comprises a PN diode; and
wherein the second diode switch comprises a PNPN diode.

6. The phase change resistor cell according to claim 5, wherein the serial diode switch outputs cell data of the phase change resistor to the bit line when a voltage level of the word line is at a high level to turn on the PN diode switch, and
the serial diode switch outputs data of the bit line to the phase change resistor when a voltage level of the word line is a negative trigger voltage to turn on the PNPN diode switch.

7. The phase change resistor cell according to claim 6, wherein after the negative trigger voltage is applied, a voltage level of the bit line drops step by step when data of the bit line are at a high level, and a voltage level of the bit line is constantly maintained when data of the bit line is at a low level.

8. The phase change resistor cell according to claim 2, wherein the serial diode switch is switched to read data stored in the phase change resistor when a voltage applied to the word line is over a first voltage level, and to write data in the phase change resistor when a voltage applied to the bit line is over the first voltage level.

9. A nonvolatile memory device using a phase change resistor cell, comprising:
a plurality of phase change resistor cell arrays each including a plurality of phase change resistor cells;
a plurality of word line driving units for selectively driving word lines of the plurality of phase change resistor cell arrays; and
a plurality of sense amplifiers for sensing and amplifying data applied through bit lines from the plurality of phase change resistor cell arrays,
wherein each phase change resistor cell comprises:
a phase change resistor having logic data corresponding to a crystallization state changed by the amount of current supplied from a word line; and
a serial diode switch, connected between the phase change resistor and a bit line, for comprising at least two or more diode switches serially connected and selectively switched depending on voltages applied to the word line and the bit line, wherein each end operation of the diode switch are connected in common to the phase change resistor and the bit line.

10. The nonvolatile memory device according to claim 9, wherein the serial diode switch comprises a plurality of PN diode chains in a silicon layer formed horizontally on an insulating layer formed on a silicon substrate,
a first upper portion of the silicon layer is contacted with the phase change resistor at a predetermined location, and second upper portions of the silicon layer are contacted with the bit line at both ends, and
a node for contacting the silicon layer with the phase change resistor is shared in a P-type region adjacent to a N-type region at the corresponding location.

11. The nonvolatile memory device according to claim 10, wherein the phase change resistor and the serial diode switch are located where the bit line and the word line are crossed, thereby forming a cross-point cell.

12. The nonvolatile memory device according to claim 10, wherein the silicon layer is formed by an epitaxial or deposition process.

13. The nonvolatile memory device according to claim 10, wherein the serial diode switch comprises:
   a PN diode switch connected in a forward direction between the phase change resistor and the bit line; and
   a PNPN diode switch connected in a reverse direction between the phase change resistor and the bit line.

14. The nonvolatile memory device according to claim 13, wherein the serial diode switch outputs cell data of the phase change resistor to the bit line when a voltage level of the word line is at a high level to turn on the PN diode switch, and
   the serial diode switch outputs data of the bit line to the phase change resistor when a voltage level of the word line is a negative trigger voltage to turn on the PNPN diode switch.

15. The nonvolatile memory device according to claim 14, wherein after the negative trigger voltage is applied, a voltage level of the bit line drops step by step when data of the bit line are at a high level, and a voltage level of the bit line is constantly maintained when data of the bit line is at a low level.

16. The nonvolatile memory device according to claim 10, wherein the serial diode switch is switched to read data stored in the phase change resistor when a voltage applied to the word line is over a first voltage level, and to write data in the phase change resistor when a voltage applied to the bit line is over the first voltage level.

17. The nonvolatile memory device according to claim 10, further comprising:
   a data bus shared by the plurality of sense amplifiers;
   a main amplifier for amplifying data of the data bus;
   a data buffer for buffering data inputted/outputted in the main amplifier; and
   an input/output port, connected to the data buffer, and for inputting/outputting data.

18. The nonvolatile memory device according to claim 10, wherein each of the plurality of phase change resistor cell arrays further comprises:
   a plurality of phase change resistor cells located where a plurality of word lines and a plurality of bit lines are crossed; and
   a plurality of bit line pull-down devices connected one by one to the plurality of the bit lines.

19. The nonvolatile memory device according to claim 10, wherein the plurality of sense amplifiers, connected one by one to the plurality of bit lines, compare and amplify voltages of the bit lines with reference voltages when a sense amplifier enable signal is activated.

20. The nonvolatile memory device according to claim 10, wherein each of the plurality of sense amplifiers, connected one by one to a pair of the bit lines, amplifies a voltage applied from the pair of the bit lines when a sense amplifier enable signal is activated.

* * * * *